United States Patent
Ando et al.

(10) Patent No.: US 10,903,425 B2
(45) Date of Patent: Jan. 26, 2021

(54) OXYGEN VACANCY AND FILAMENT-LOSS PROTECTION FOR RESISTIVE SWITCHING DEVICES

(71) Applicant: International Business Machines Corporation, Armonk, NY (US)

(72) Inventors: Takashi Ando, Tuckahoe, NY (US); Hiroyuki Miyazoe, White Plains, NY (US); Seyoung Kim, Weschester, NY (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/122,134

(22) Filed: Sep. 5, 2018

(65) Prior Publication Data
US 2020/0075860 A1 Mar. 5, 2020

(51) Int. Cl.
*H01L 45/00* (2006.01)
*H01L 27/24* (2006.01)

(52) U.S. Cl.
CPC ...... *H01L 45/1683* (2013.01); *H01L 27/2436* (2013.01); *H01L 27/2463* (2013.01); *H01L 45/08* (2013.01); *H01L 45/1233* (2013.01); *H01L 45/1253* (2013.01); *H01L 45/146* (2013.01); *H01L 45/1616* (2013.01)

(58) Field of Classification Search
CPC combination set(s) only.
See application file for complete search history.

(56) References Cited

U.S. PATENT DOCUMENTS

| | | | |
|---|---|---|---|
| 7,985,646 B2 | 7/2011 | Yoo et al. | |
| 8,017,457 B2 | 9/2011 | Kajigaya | |
| 8,237,457 B2 | 8/2012 | Chakravarti et al. | |
| 8,238,132 B2 | 8/2012 | Kitagawa | |
| 9,000,409 B2 | 4/2015 | Huo et al. | |
| 9,153,624 B2 | 10/2015 | Jo | |
| 9,647,037 B2 | 5/2017 | Lu et al. | |
| 9,768,231 B2 | 9/2017 | Tran et al. | |
| 2007/0272960 A1 | 11/2007 | Hsu et al. | |
| 2010/0155687 A1* | 6/2010 | Reyes | H01L 45/04 257/4 |
| 2012/0049369 A1* | 3/2012 | Mitsuyama | H01L 21/7687 257/751 |

(Continued)

OTHER PUBLICATIONS

Electronic Materials Research Laboratory, "Redox-based Tera-bit memories," http://www.emrl.de/r_a_1.html (retrieved Jan. 3, 2018), 10 pages.

(Continued)

*Primary Examiner* — Nduka E Ojeh
(74) *Attorney, Agent, or Firm* — Cantor Colburn LLP; Randall Bluestone (57) ABSTRACT

Embodiments of the invention are directed to a fabrication method that includes forming a dielectric region of a wafer, forming a bottom contact embedded within the dielectric region such that a top surface of the bottom contact is exposed, and forming a dummy resistive switching element over the top surface of the bottom electrode. Portions of the dummy resistive switching element are exposed to at least one oxide source. The dummy resistive switching element is replaced with a resistive switching element stack.

20 Claims, 8 Drawing Sheets

(56) References Cited

U.S. PATENT DOCUMENTS

| | | | |
|---|---|---|---|
| 2015/0129961 A1* | 5/2015 | Li | H01L 29/40 257/347 |
| 2015/0262663 A1 | 9/2015 | Lee et al. | |
| 2016/0087199 A1* | 3/2016 | Jang | H01L 45/04 257/4 |
| 2016/0359108 A1* | 12/2016 | Majhi | H01L 45/1233 |
| 2017/0236869 A1* | 8/2017 | Tran | H01L 27/2463 257/4 |
| 2018/0286858 A1 | 10/2018 | Liu et al. | |
| 2019/0272875 A1* | 9/2019 | Hwang | H01C 17/006 |

OTHER PUBLICATIONS

Hayakawa et al., "Highly reliable TaOx ReRAM with centralized filament for 28-nm embedded application," 2015 Symposium on VLSI Technology Digest of Technical Papers, IEEE, 2015, pp. T14-T15.

Wong et al., "Metal-Oxide RRAM," Proceedings of the IEEE, vol. 100, No. 6, Jun. 2012, pp. 1951-1970.

* cited by examiner

OXYGEN VACANCY AND FILAMENT-LOSS PROTECTION FOR RESISTIVE SWITCHING DEVICES

BACKGROUND

The present invention relates in general to resistive switching devices (RSDs). More specifically, the present invention relates to fabrication methods and resulting structures that protect the metal oxide of RSDs from losing oxygen vacancies and filaments.

Resistive random access memory (RRAM) is a nano-scale non-volatile memory (NVM). RRAM provides simple storage cell components, high density, low power, large endurance, fast write/read/erase speeds, and excellent scalability. A typical RRAM storage cell is two-terminal device formed as a metal-insulator-metal (MIM) structure. The insulator material can be a binary metal oxide, which makes the MIM storage cell compatible with silicon-based CMOS (complementary metal oxide semiconductor) fabrication process. When a sufficient electrical field or signal is applied across the metal electrodes of a MIM, the resistance of the insulator can be switched from one resistance state to another through various mechanisms, including the formation and rupture of conductive filaments in the metal oxide. The oxygen vacancy concentration ($V_O$) in the oxide of the binary metal oxide and the state of the insulator/electrode interface are significant factors in controlling the resistive switching mechanism in a MIM memory cell. The insulator retains its resistance state until an appropriate electrical signal is applied across the MIM metal electrodes to change it.

SUMMARY

Embodiments of the invention are directed to a fabrication method that includes forming a dielectric region of a wafer, forming a bottom contact embedded within the dielectric region such that a top surface of the bottom contact is exposed, and forming a dummy resistive switching element over the top surface of the bottom contact. Portions of the dummy resistive switching element are exposed to at least one oxide source. The dummy resistive switching element is replaced with a resistive switching element stack.

Embodiments of the invention are directed to a method of forming a resistive switching device. A non-limiting example of the method includes forming a dielectric region of a wafer, forming a bottom contact embedded within the dielectric region such that a top surface of the bottom contacting is exposed, and forming a dummy resistive switching element over the top surface of the bottom contact. Portions of the dummy resistive switching element are exposed to at least one oxide source. The dummy resistive switching element is removed such that a space that was occupied by the dummy switching element defines a first trench having a bottom surface and sidewalls. A resistive switching element stack is formed on the bottom surface and the sidewalls of the first trench such that the resistive switching element stack defines a second trench. A top contact is formed within the second trench and over the resistive switching element stack, a top electrode is communicatively coupled to the top contact, and a bottom electrode is communicatively coupled to the bottom contact. The resistive switching device includes the bottom electrode, the resistive switching element stack, and the top electrode.

Embodiment of the invention are directed to a resistive switching device that includes a bottom contact embedded within a dielectric region of a wafer, a first trench formed above a top surface of the bottom contact, and a resistive switching element stack on a bottom surface and sidewalls of the first trench. The resistive switching element stack defines a second trench. A top contact is within the second trench and over the resistive switching element stack, a top electrode is communicatively coupled to the top contact, and a bottom electrode is communicatively coupled to the bottom contact. The resistive switching device includes the bottom electrode, the resistive switching element stack, and the top electrode.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 3-15 illustrate cross-sectional views depicting the results of fabrication operations in accordance with embodiments of the invention, in which:

DETAILED DESCRIPTION

It is understood in advance that, although this detailed description provides fabrication methods and resulting structures for a specific RSD architecture, implementing the teachings recited herein are not limited to a particular RSD architecture or operating environment. Rather, embodiments of the present invention are capable of being implemented in conjunction with any other type of RSD (e.g., phase change memory, spin-transfer torque memory, and the like) or operating environment (e.g., RAM, neuromorphic computing applications, etc.), now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, with the growth of digital data applications, there is a need for increasingly fast and scalable memory technologies for data storage and data-driven computation. RRAM is a high speed, high density, and low fabrication-cost NVM technology. Thus, RRAM has the potential to replace and/or complement the limited scaling of flash memories and other silicon-based memories such as dynamic random access memory (DRAM) and static random access memory (SRAM).

A typical RRAM storage cell is a two-terminal device formed as a metal-insulator-metal (MIM) structure, which is a simpler construction than the three terminal storage cells used in conventional CMOS-based DRAM or flash memory. The insulator material in the MIM device can be a binary metal oxide, which makes fabricating a MIM RRAM storage cell compatible with silicon-based CMOS fabrication process. The resistance of a RRAM storage cell serves as the switchable conduction state that stores data. When a sufficient electrical field/signal is applied across the metal electrodes of a MIM, the resistance of the insulator can be switched from one resistance state to another through various mechanisms, including the formation and rupture of one-dimensional conductive filaments formed in the metal oxide during electroforming. The formation and rupture of the conducting filaments involves various reduction-oxidation (redox) reactions and depends on the metal/electrode material. The oxygen vacancy concentration ($V_O$) in the oxide of the binary metal oxide and the state of the insulator/electrode interface are significant factors in controlling the resistive switching mechanism in a MIM memory cell. Thus, it is desirable to use insulators in the form of oxides with a high mobility of oxygen vacancies, examples of which include, for example, single-layer nonstoichiometric or double-layer oxide structures with ionic bonding. The insulator can be a resistive switching element stack that includes a metal oxide and a reactive electrode. Oxygen vacancy formation in the filament region can be enhanced and controlled by interactions between the metal oxide and the reactive electrode.

Because the creation of oxygen vacancies in the MIM metal oxide layer is a building block for creating current conducting filaments, RRAM storage cells need to be fabricated in a manner that forms and preserves oxygen vacancies that have been formed in the metal oxide. However, known RRAM fabrication methods require etching to form the individual MIM cells, which can damage filaments at the etched edges of each cell. Additionally, known RRAM fabrication methods expose the filaments formed in the MIM metal oxide to multiple oxygen sources (e.g., ambient air, surrounding materials, etc.), which can react with the filaments and reduce the oxygen vacancies, which are required for resistive switching. As a result, the filaments and oxygen vacancies that have been formed in the MIM metal oxide need to be protected with a robust encapsulation scheme to prevent oxygen penetration during the subsequent processes. The structures that provide encapsulation (e.g., sidewalls surrounding the metal oxide) add fabrication steps and increase device footprint, which limit the scalability of RRAM storage cells.

Turning now to an overview of aspects of the invention, embodiments of the invention provide fabrication methods and resulting structures that protect the metal oxide (or resistive switching element) of RSDs from losing filament because of exposure to oxygen sources during RRAM fabrication. In embodiments of the invention, a dummy resistive switching element is deposited over the bottom electrode then patterned and etched to function as a placeholder for the metal oxide stack that will be in the final device. Subsequent RRAM fabrication operations are performed including operations that expose the patterned and etched dummy reactive switching element to multiple oxygen sources (e.g., ambient air, surrounding materials, etc.). Because the dummy reactive switching element is a placeholder, no filaments have been formed, and no oxygen vacancies have been formed. Accordingly, there is no danger that exposing the dummy reactive switching element to multiple oxygen sources will allow oxygen from the oxygen sources to react with filaments and reduce the oxygen vacancies, which are required for resistive switching.

The dummy resistive switching element is removed and replaced with the metal oxide stack that will be in the final MIM of the RRAM storage cell. In embodiments of the invention, when the dummy resistive switching element is removed, the space that was occupied by the dummy resistive switching element forms a first trench having a bottom surface and sidewalls. In embodiments of the invention, a top surface of a bottom contact metal forms the bottom surface of the first trench. In embodiments of the invention the metal oxide stack is deposited along the bottom surface and sidewalls of the first trench such that the metal oxide stack forms a second trench, and a top contact metal is deposited in the second trench.

Because the metal oxide stack formed according to aspects of the invention is not etched, there is no damage to filaments at the etched edges of each MIM cell. Additionally, because the metal oxide stack formed according to aspects of the invention is not exposed to oxygen sources (e.g., ambient air, surrounding materials, etc.), the oxygen sources cannot react with the filaments in the metal oxide stack and reduce the oxygen vacancies, which are required for resistive switching, and there is no need to protect the metal oxide stack with a robust encapsulation scheme to prevent oxygen penetration during the subsequent processes. Because the structures that provide encapsulation (e.g., sidewalls surrounding the metal oxide) add fabrication steps and increase device footprint, the scalability of RRAM storage cells using embodiment of the invention is improved.

Figure 1A:
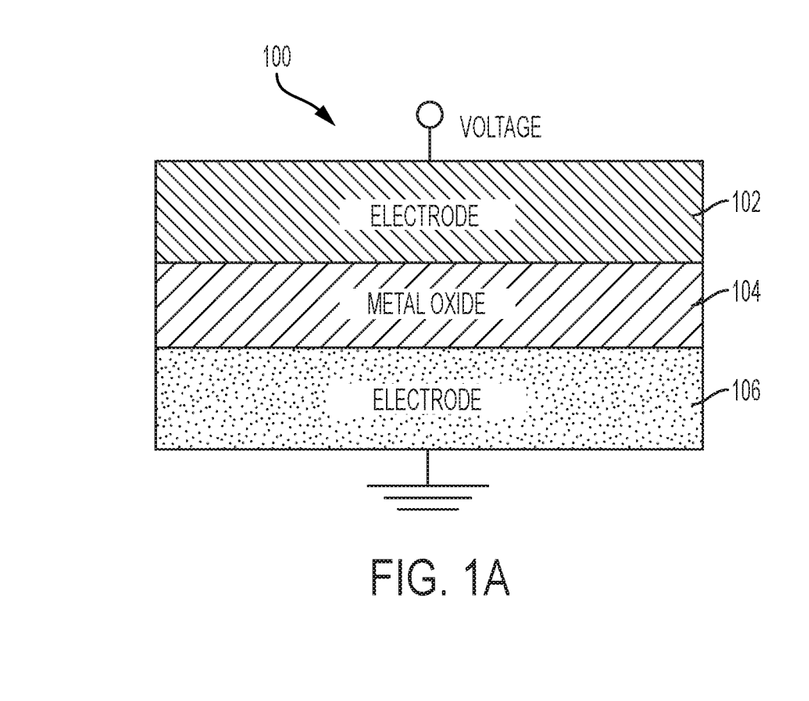
FIG. 1A depicts a simplified block diagram illustrating a cross-sectional view of a two-terminal resistive switching device (RSD), which can be used as a storage cell of an RRAM structure capable of incorporating aspects of the invention.

Turning now to a more detailed description of example embodiments of the invention, FIG. 1A depicts a simplified block diagram illustrating a cross-sectional view of a two-terminal RSD component 100, which can be used as a storage cell of an RRAM structure (e.g., crossbar array 200 shown in FIG. 2) capable of incorporating aspects of the invention. The RSD storage cell 100 includes a top electrode 102, a metal oxide active region 104, and a bottom electrode 106, configured and arranged as shown. When a sufficient electrical signal (e.g., a voltage) is applied across the top/bottom electrodes 102, 106, the resistance of the metal oxide 104 can be switched from one resistance state to another. The metal oxide 104 retains its current resistance state until an appropriate electrical signal is applied across the top/bottom electrodes 102, 106 to change it.

Figure 1B:
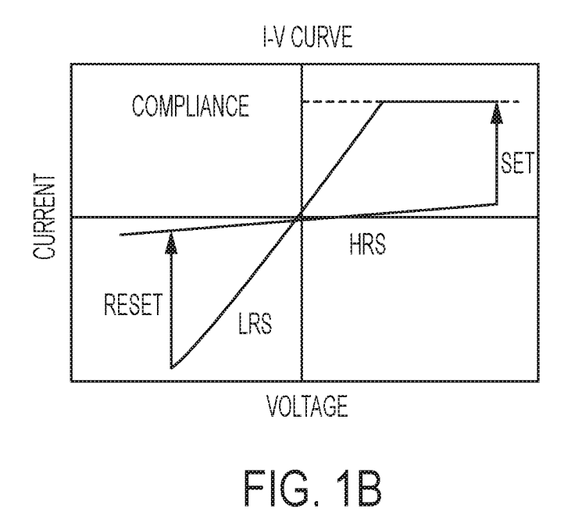
FIG. 1B depicts a diagram of an I-V curve illustrating the switching operation of the RSD component shown in FIG. 1A.

FIG. 1B depicts a diagram of an I-V curve illustrating the switching operation of the RSD storage cell 100. The operation principle of the RSD storage cell 100 is based on the reversible resistive switching (RS) between at least two stable resistance states, namely the high resistance state (HRS) and low resistance state (LRS), which occur in the metal oxide 104. In general, the operation that changes the resistance of the storage cell 100 from a high resistance state (HRS) to a low resistance state (LRS) is called a SET process, while the opposite process is defined as a RESET process. The specific resistance state (HRS or LRS) can be retained after the electric stress is cancelled, which indicates the nonvolatile nature of RRAM. For an initial write operation, a voltage larger than the SET voltage is needed in order to "turn on" the resistive switching behaviors of the metal oxide 104 for the subsequent cycles. This is often referred to as the forming process or the electroforming process.

Based on the electrical polarity's relationship between the SET process and the RESET processes, the resistive switching behaviors of the storage cell 100 can be divided into two modes, which are known as a unipolar mode (not shown) and a bipolar mode (shown in FIG. 1B). In the unipolar switching mode, both SET and RESET transitions are achieved by applying electrical voltages of the same polarity (e.g., a positive voltage). In the bipolar switching mode, SET and RESET transitions are executed by applying voltages of opposite polarities (e.g., a positive voltage SET and a negative voltage RESET). In both cases, the current is limited by a compliance level during the abrupt set transition in order to suitably control the size of current conducting filament and the corresponding LRS resistance value.

Figure 2:
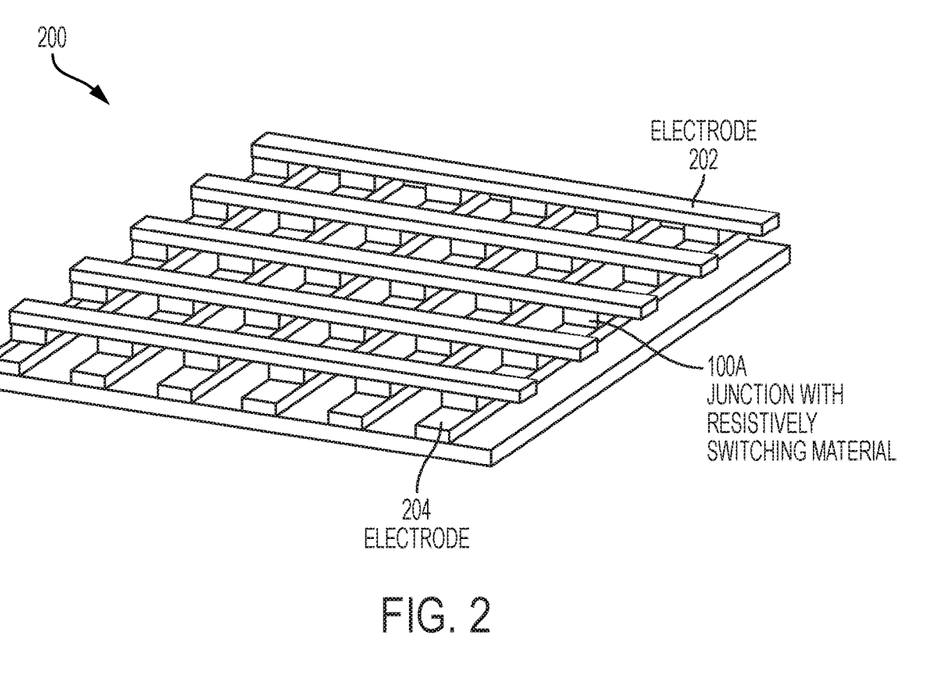
FIG. 2 depicts a simplified block diagram illustrating how the RSD component shown in FIG. 1A can be utilized as an addressable cross-point storage cell of an RRAM crossbar array capable of incorporating aspects of the invention.

Because RSD storage cell 100 uses only two external terminals, these memories can be accommodated in a crossbar array 200, which is shown in FIG. 2. The crossbar array 200 illustrates how the RSD storage cell 100 shown in FIG. 1A can be utilized as an addressable cross-point memory/storage cell 100A of the crossbar array 200, which is capable of incorporating aspects of the invention. The array 200 includes perpendicular conductive top electrode lines 202 (e.g., wordline rows), conductive bottom electrode lines 204 (e.g., bitline columns), and resistive switching element memory/storage cells 100A at the intersection between each top electrode line 202 and bottom electrode line 204. Contact liners/metals (e.g., contact liners/metals 350, 352, 360, 362, 1202, 1302, 1502, 1504 shown in FIG. 15) can be used to couple the resistive switching element memory/storage cell 100A to the top and bottom electrode lines 202, 204. The storage cell 100A and electrode lines 202, 204 can be configured to operate the same as the storage cell 100 shown in FIG. 1A. Each storage cell 100A can be accessed for read and write by using transistors (e.g., transistor 330 shown in FIG. 3) to bias the corresponding top electrode line 202 and bottom electrode line 204.

The crossbar array 200 is compatible with a variety of electronic circuits and devices, including ultra-high density NVM and artificial neural network (ANN) architectures. In neuromorphic computing applications (e.g., ANN), the RSD 100, 100A can be used as a connection (synapse) between a pre-neuron and a post-neuron, thus representing the connection weight in the form of device resistance. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as ANNs carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/ANN for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read. Multiple pre-neurons and post-neurons can be connected through an array of RRAMs, which naturally expresses a fully-connected neural network.

Figure 3:
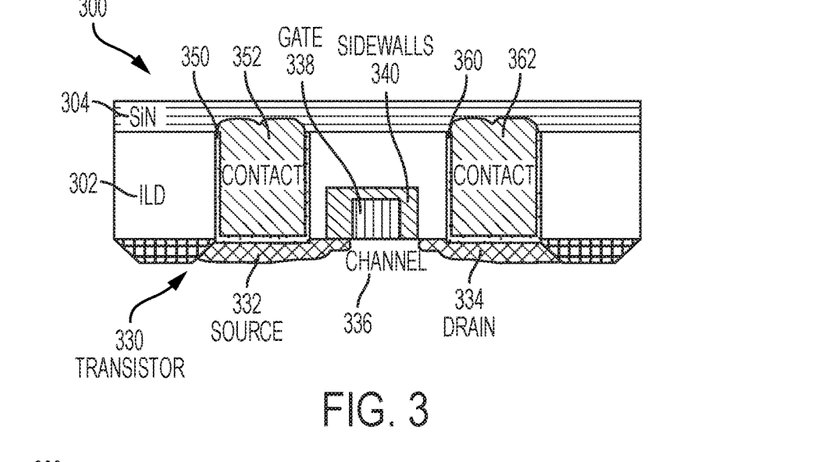
FIG. 3 depicts a simplified block diagram showing a cross-sectional view of a portion of a semiconductor wafer after fabrication operations according to aspects of the invention.

FIGS. 3-15 depict the results of various fabrication operations for forming a RSD in accordance with aspects of the invention. FIG. 3 depicts a cross-sectional view of a portion of a wafer 300 after an initial set of fabrication having been used to form the structures shown. At this stage of the fabrication process, the wafer 300 includes an interlayer dielectric (ILD) region 302 formed over a transistor 330. In embodiment of the invention, the ILD region 302 can be $SiO_2$. Trenches have been formed in the ILD 302 and filled with metal barrier layers 350, 360 and contact metals 352, 362. A polished SiN layer 304 is over the ILD 302 and the contact metals 352, 362. The transistor 330 includes a source region 332, a drain region 334, and a channel region 336. A gate region 338 and gate sidewalls 340 are formed over the channel region 336. The contact metal 352 is over the source region 332, and the contact metal 362 is over the drain region 334. The contact metal 362 will function as the connection to the bottom electrode in the final RSD device (not shown). The contact metal 362 will be part of the final resistive switching element stack 1310 (shown in FIG. 13). The transistor 330 will function as an access device that can select the resistive switching element stack 1310 and allow current to flow through the resistive switching element stack 1310 so it can be read or written to. A variety of known fabrication operations are suitable for forming the wafer 300 shown in FIG. 3 so the details of such operations have been omitted in the interest of brevity.

Figure 4:
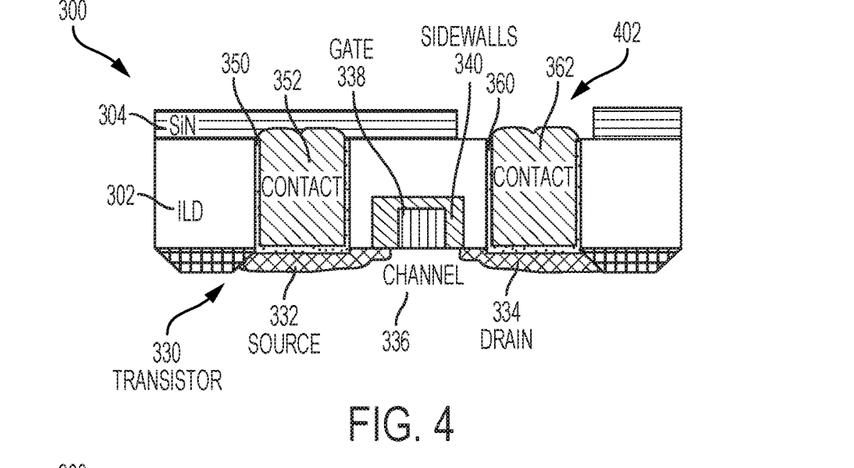
FIG. 4 depicts a simplified block diagram showing a cross-sectional view of a portion of a semiconductor wafer after fabrication operations according to aspects of the invention.

In FIG. 4, known fabrication operations have been used to form trench/opening 402 in the SiN layer 304 to expose a top surface of the contact metal 362.

Figure 5:
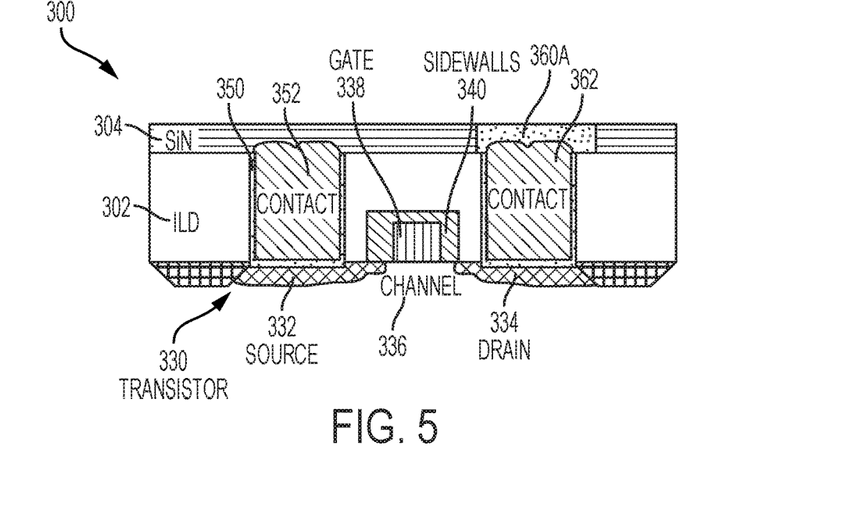
FIG. 5 depicts a simplified block diagram showing a cross-sectional view of a portion of a semiconductor wafer after fabrication operations according to aspects of the invention.

In FIG. 5, known fabrication operations have been used to deposit and polish an additional metal barrier region over the contact metal 362, thereby forming metal barrier 360A.

Figure 6:
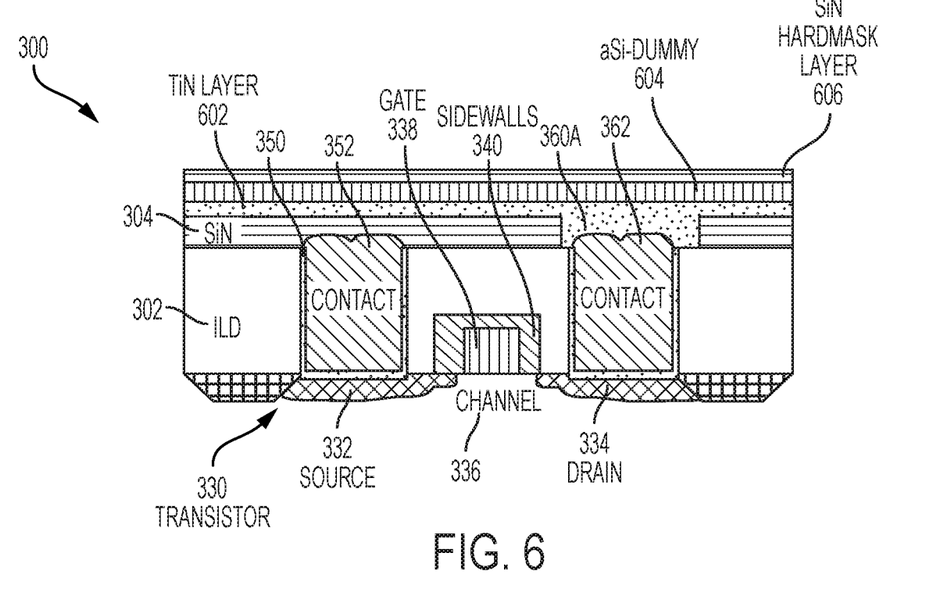
FIG. 6 depicts a simplified block diagram showing a cross-sectional view of a portion of a semiconductor wafer after fabrication operations according to aspects of the invention.

In FIG. 6, known fabrication operations have been used to deposit a TiN layer 602 over the SiN layer 304 and the barrier metal 360A, a dummy reactive switching material layer 604 over the TiN layer 602, and a SiN hardmask 606 over the dummy reactive switching material layer 604. In embodiments of the invention, the dummy reactive switching material layer 602 is amorphous silicon (aSi). Any suitable deposition process can be used to deposit the layers 602, 604, 606.

Figure 7:
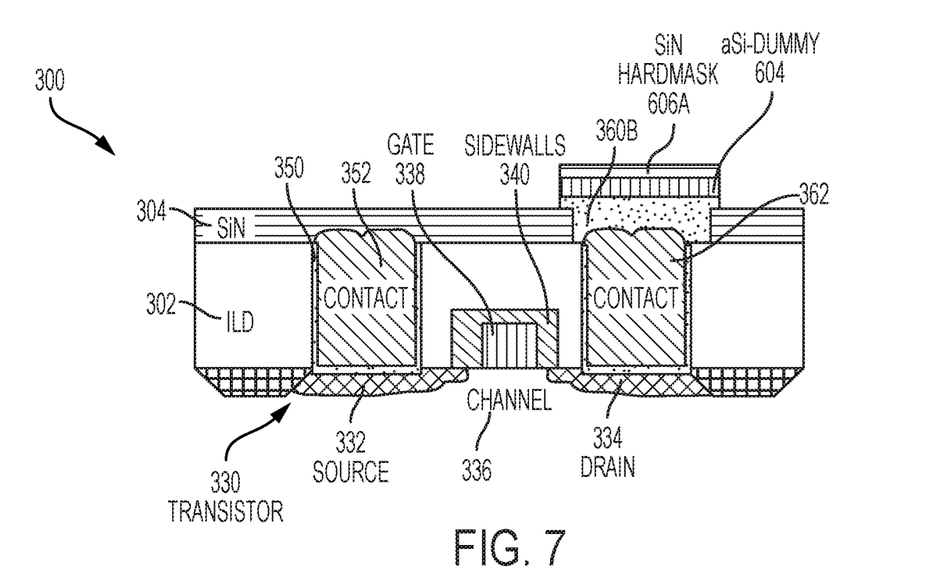
FIG. 7 depicts a simplified block diagram showing a cross-sectional view of a portion of a semiconductor wafer after fabrication operations according to aspects of the invention.

In FIG. 7, known fabrication operations have been used to pattern and etch the SiN hardmask layer 606 to form the SiN hardmask 606A. A timed etch is applied to remove the portions of the dummy reactive switching layer 604 and the TiN layer 602 that are not under the SiN hardmask 606A, thereby forming a dummy reactive switching element 604A. The etch is timed to stop just into the SiN layer 304.

Figure 8:
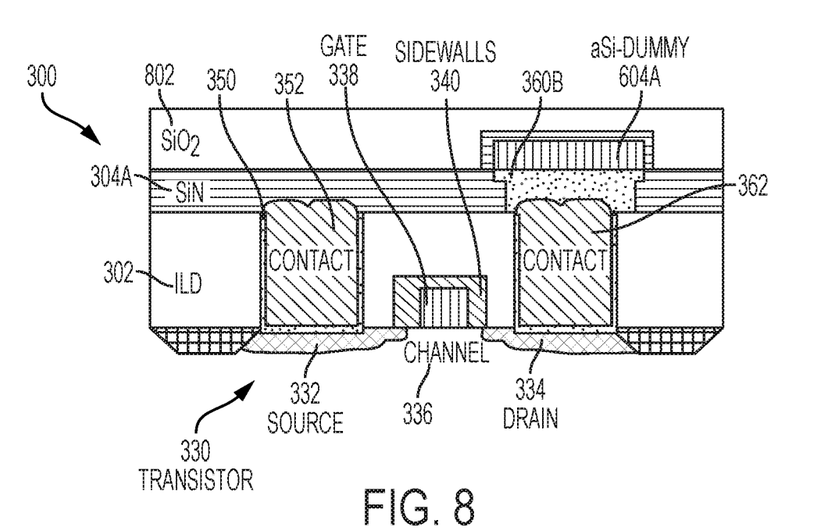
FIG. 8 depicts a simplified block diagram showing a cross-sectional view of a portion of a semiconductor wafer after fabrication operations according to aspects of the invention.

In FIG. 8, known fabrication operations have been used to deposit an additional layer of SiN to encapsulate the dummy reactive switching element 604A, thereby forming a SiN layer 304A. An $SiO_2$ layer 802 is deposited over the SiN layer 304A and polished. The encapsulating $SiO_2$ layer 802 is known oxygen source.

Figure 9:
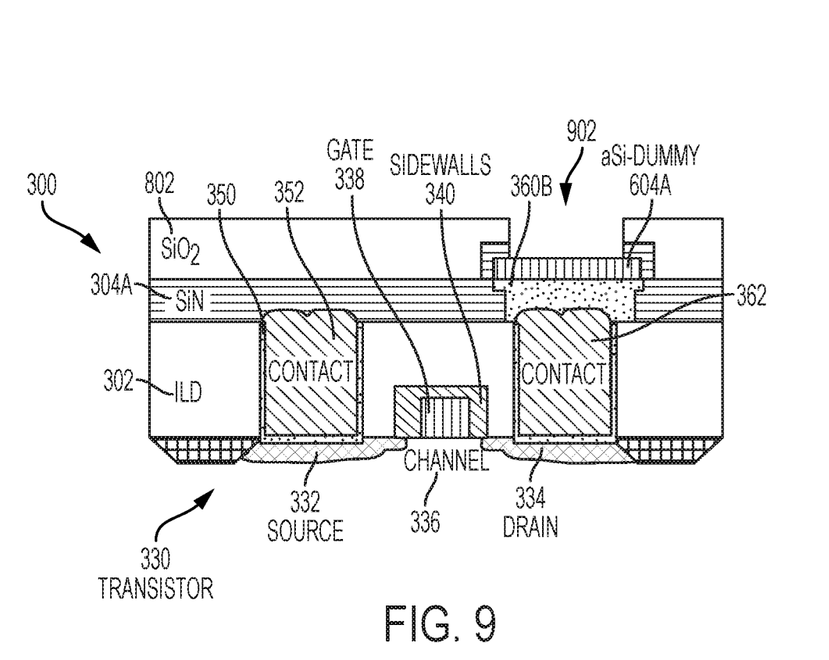
FIG. 9 depicts a simplified block diagram showing a cross-sectional view of a portion of a semiconductor wafer after fabrication operations according to aspects of the invention.

In FIG. 9, known fabrication operations have been used to etch through selected portions of the $SiO_2$ layer 802 and the SiN layer 304A to form trench/opening 902 and expose a top surface of the dummy reactive switching element 604A.

Figure 10:
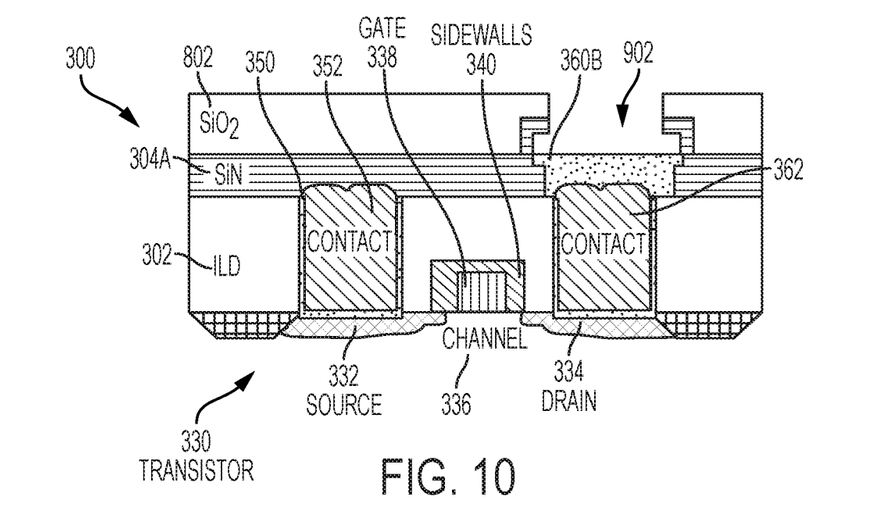
FIG. 10 depicts a simplified block diagram showing a cross-sectional view of a portion of a semiconductor wafer after fabrication operations according to aspects of the invention.

In FIG. 10, known fabrication operations have been used to remove the dummy reactive switching element 604A, using, for example, a wet etch (e.g., using TMAH, TEAH, $NH_4OH$, and the like), thereby forming trench/opening 902A.

Figure 11:
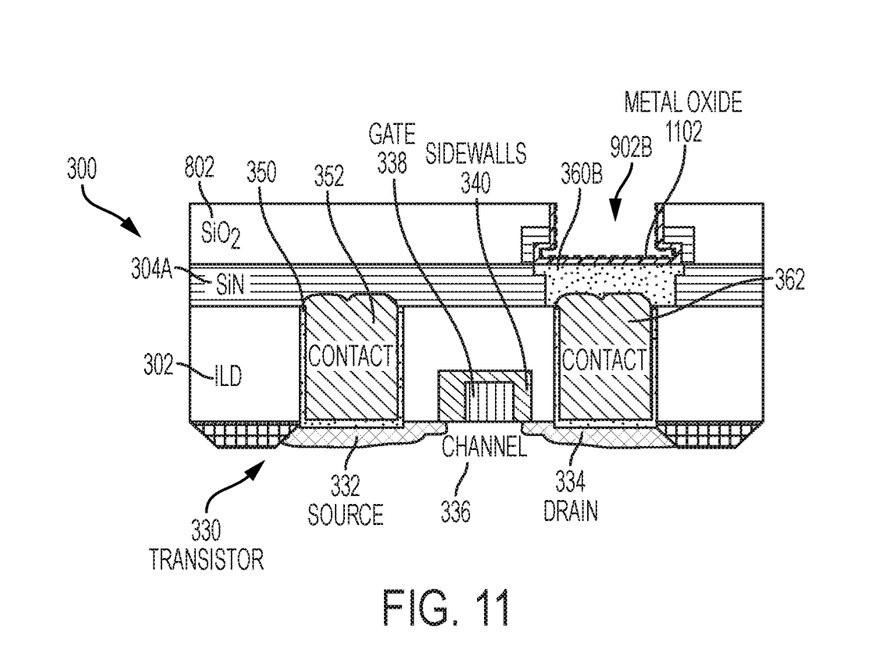
FIG. 11 depicts a simplified block diagram showing a cross-sectional view of a portion of a semiconductor wafer after fabrication operations according to aspects of the invention.

In FIG. 11, known fabrication operations have been used to deposit a layer of metal oxide 1102 along the sidewalls and bottom of the trench/opening 902A (shown in FIG. 10). The layer of metal oxide 1102 defines a trench/opening 902B. In embodiments of the invention, the metal oxide (e.g. $HfO_2$, $Ta_2O_5$) is deposited using an atomic layer deposition (ALD) process.

Figure 12:
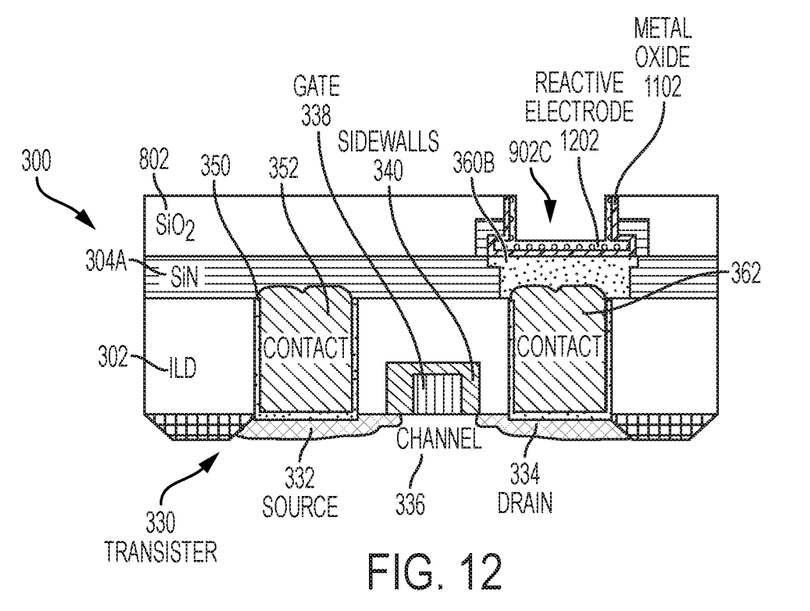
FIG. 12 depicts a simplified block diagram showing a cross-sectional view of a portion of a semiconductor wafer after fabrication operations according to aspects of the invention.

In FIG. 12, known fabrication operations have been used to deposit a reactive electrode layer 1202 (e.g. an ALD of TiN/Al-containing alloy/TiN, or a PVD of Ti, Al, TiN, and laminates/alloys thereof) along sidewalls and a bottom of the trench/opening 902B (shown in FIG. 11). The reactive electrode layer 1202 defines a trench/opening 902C. In embodiments of the invention, an optional barrier layer (e.g., an ALD of TaN) (not shown) can be deposited over the reactive electrode layer 1202. The optional barrier layer can protect against metal diffusion for certain type of contact metal materials (e.g., Cu) but is not needed for other types of contact metal material (e.g., W).

Figure 13:
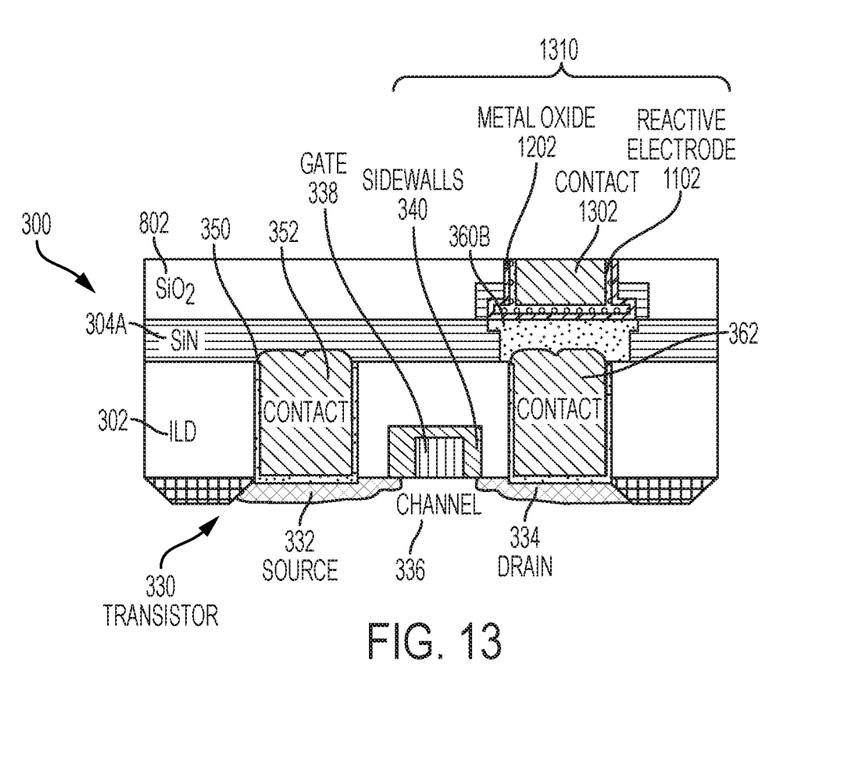
FIG. 13 depicts a simplified block diagram showing a cross-sectional view of a portion of a semiconductor wafer after fabrication operations according to aspects of the invention.

In FIG. 13, known fabrication operations (e.g. sputtering, etc.) have been used to deposit and CMP a contact metal 1302 in the trench/opening 902C (shown in FIG. 12). In embodiments of the invention, the contact metal 1302 can be a low resistivity metal (e.g. W). After the fabrication operations shown in FIG. 13, a complete resistive switching element stack 1310 has been formed in accordance with aspects of the invention.

Figure 14:
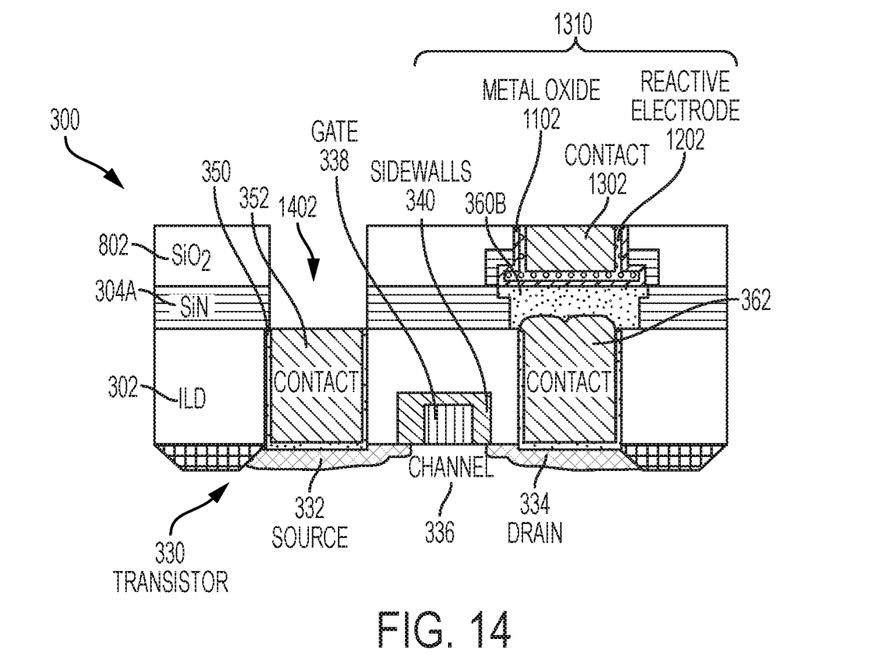
FIG. 14 depicts a simplified block diagram showing a cross-sectional view of a portion of a semiconductor wafer after fabrication operations according to aspects of the invention.

In FIG. 14, known fabrication operations have been used to form trench/opening 1402 in the $SiO_2$ layer 802 and the SiN layer 304 to expose a top surface of the contact metal 352.

Figure 15:
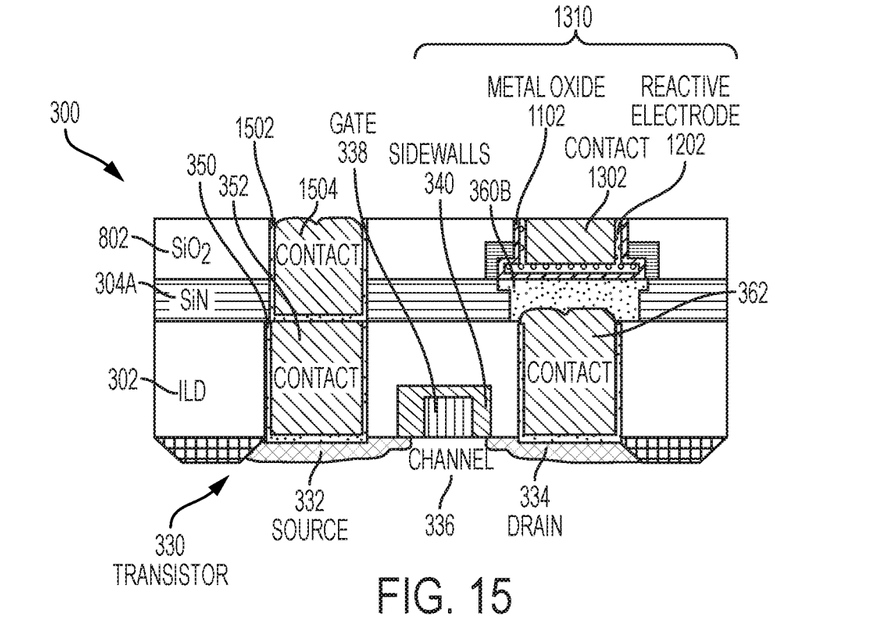
FIG. 15 depicts a cross-sectional view of a portion of a semiconductor wafer after fabrication operations according to aspects of the invention

In FIG. 15, known fabrication operations (e.g. sputtering, etc.) have been used to deposit a barrier metal region 1502 along sidewalls and a bottom of the trench/opening 1402 (shown in FIG. 14), and to deposit and CMP a contact metal 1504 in the trench/opening (not shown) defined by the barrier metal region 1502. In embodiments of the invention, the contact metal 1302 can be a low resistivity metal (e.g. W). The fabrication operations continue with fabrication of known upper level metallization structures and operations.

In embodiment of the invention, the resistivity values ("p") for the low resistivity metals used for the contacts 352, 1504, 362, 1302 can be between about $1 \times 10^{-8}$ ohm meters and about $3 \times 10^{-6}$ ohm meters. A material can generally be considered to have low resistivity if its resistivity is below about $1 \times 10^6$ ohm meters. The electrical resistivity of a particular conductor material is a measure of how strongly the material opposes the flow of electric current through it. This resistivity factor, sometimes called its "specific electrical resistance," enables the resistance of different types of conductors to be compared to one another at a specified temperature according to their physical properties without regards to their lengths or cross-sectional areas. Thus, the higher the resistivity value of p the more resistance and vice versa. For example, the resistivity of a good conductor such as copper is on the order of $1.72 \times 10^{-8}$ ohm meters, whereas the resistivity of a poor conductor (insulator) such as air can be well over $1.5 \times 10^{14}$ ohm meters. Materials such as Cu and Al are known for their low levels of resistivity thus allowing electrical current to easily flow through them making these materials.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A fabrication method comprising:
   forming a dielectric region of a wafer;
   forming a bottom electrode embedded within the dielectric region such that a top surface of the bottom electrode is exposed;
   forming a dummy resistive switching element over the top surface of the bottom electrode;
   exposing portions of the dummy resistive switching element to at least one oxide source; and
   replacing the dummy resistive switching element with a resistive switching element stack;
   forming a top electrode over the resistive switching element stack;
   wherein a resistive switching device (RSD) comprises, the bottom electrode, the resistive switching element stack, and the top electrode; and
   wherein the resistive switching element of the RSD is not etched during formation of the RSD.

2. The method of claim 1 further comprising coupling an active region of a transistor to the bottom electrode.

3. The method of claim 1, wherein the top electrode comprises a barrier metal layer and a low resistivity metal.

4. The method of claim 1, wherein the resistive switching element stack comprises a filament region.

5. The method of claim 4, wherein the filament region comprises a metal oxide.

6. The method of claim 5, wherein the metal oxide comprises a compound selected from the group consisting of $HfO_2$, $Ta_2O_5$, and $ZrO_2$.

7. The method of claim 4, wherein the resistive switching element stack further comprises a reactive electrode.

8. The method of claim 7, wherein oxygen vacancy formation in the filament region is controlled by the reactive electrode.

9. The method of claim 7, wherein the reactive electrode comprises a reactive electrode stack comprising:
   a first layer comprising TiN;
   a second layer comprising an Al containing alloy; and
   a third layer comprising TiN.

10. A method of forming a resistive switching device (RSD), the method comprising:
    forming a dielectric region of a wafer;
    forming a bottom electrode embedded within the dielectric region such that a top surface of the bottom electrode is exposed;
    forming a dummy resistive switching element over the top surface of the bottom electrode;
    exposing portions of the dummy resistive switching element to at least one oxygen source;
    removing the dummy resistive switching element such that a space that was occupied by the dummy switching element defines a first trench having a bottom surface and sidewalls; and
    forming a resistive switching element stack on the bottom surface and the sidewalls of the first trench such that the resistive switching element stack defines a second trench; and
    forming a top electrode within the second trench and over the resistive switching element stack;
    wherein the RSD comprises the bottom electrode, the resistive switching element stack, and the top electrode; and
    wherein the resistive switching element of the RSD is not etched during formation of the RSD.

11. The method of claim 10, wherein the resistive switching element stack is formed on the bottom surface and the sidewalls of the first trench using an atomic layer deposition process.

12. The method of claim 10, wherein the at least one oxygen source comprises ambient gas or a portion of the dielectric region.

13. The method of claim 10, wherein:
    the top electrode comprises a first barrier metal layer and a first low resistivity metal; and
    the bottom electrode comprises a second barrier metal layer and a second low resistivity metal.

14. The method of claim 10, wherein the resistive switching element stack comprises a filament region.

15. The method of claim 14, wherein the filament region comprises a metal oxide.

16. The method of claim 15, wherein the metal oxide comprises a compound selected from the group consisting of $HfO_2$, $Ta_2O_5$, and $ZrO_2$.

17. The method of claim 14, wherein the resistive switching element stack further comprises a reactive electrode.

18. The method of claim 17, wherein oxygen vacancy formation in the filament region is controlled by the reactive electrode.

19. The method of claim 17, wherein the reactive electrode comprises a reactive electrode stack comprising:
   a first layer comprising TiN;
   a second layer comprising an Al-containing alloy; and
   a third layer comprising TiN.

20. A resistive switching device (RSD) comprising:
   a bottom electrode embedded within a dielectric region of a wafer;
   a first trench formed above a top surface of the bottom electrode;
   a non-etched resistive switching element stack on a bottom surface and sidewalls of the first trench, wherein the non-etched resistive switching element stack defines a second trench; and
   a top electrode within the second trench and over the non-etched resistive switching element stack;
   wherein the RSD comprises the bottom electrode, the non-etched resistive switching element stack, and the top electrode.

* * * * *